United States Patent
Voorman et al.

(10) Patent No.: US 6,381,082 B1
(45) Date of Patent: Apr. 30, 2002

(54) ARRANGEMENT FOR READING INFORMATION FORM A RECORD CARRIER

(75) Inventors: Johannes O. Voorman; Johannes W. M. Bergmans, both of Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/439,201

(22) Filed: Nov. 12, 1999

(30) Foreign Application Priority Data

Nov. 12, 1998 (EP) .............................. 98402802
Jan. 19, 1999 (EP) .............................. 99200165

(51) Int. Cl.⁷ .............................................. G11B 5/02
(52) U.S. Cl. ........................ 360/25; 360/46; 360/53
(58) Field of Search ........................... 360/55, 53, 25, 360/46

(56) References Cited

U.S. PATENT DOCUMENTS

| | | | | |
|---|---|---|---|---|
| 5,418,660 A | * | 5/1995 | Sato et al. ...................... | 360/65 |
| 5,737,140 A | * | 4/1998 | Carr .............................. | 360/29 |
| 5,818,656 A | * | 10/1998 | Klaassen et al. ............... | 360/67 |
| 6,137,643 A | * | 10/2000 | Flynn ........................... | 360/25 |
| 6,173,019 B1 | * | 1/2001 | Hee et al. ..................... | 375/319 |
| 6,304,396 B1 | * | 10/2001 | Ramalho et al. .............. | 360/25 |

FOREIGN PATENT DOCUMENTS

| | | | | |
|---|---|---|---|---|
| EP | 0439299 A2 | 1/1991 | ........... | G11B/20/24 |
| EP | 0783168 A2 | 7/1997 | ........... | G11B/20/10 |
| EP | 0785555 A1 | 7/1997 | ........... | G11B/27/36 |

* cited by examiner

*Primary Examiner*—Regina Y. Neal
*Assistant Examiner*—Son H Nguyen
(74) *Attorney, Agent, or Firm*—Edward W. Goodman

(57) ABSTRACT

An arrangement for reading information from a record carrier, such as in a HDD, include a read head ($R_{mr1}$), an amplifier (74) for amplifying the signal read by the read head, an equalizer (76) for equalizing the signal read by the read head, and a bit detector (80) for detecting bits in the signal read by the read head. The invention, the arrangement further comprises a DC correction unit (78) for subtracting a correction value from an input signal in response to an error signal so as to obtain a DC corrected output signal. The bit detector (80) detects a sequence of bits based in the DC corrected output signal. Further, an error signal generating unit (82,83,85) is present for generating the error signal in response to the DC corrected output signal and the sequence.

5 Claims, 4 Drawing Sheets

ARRANGEMENT FOR READING INFORMATION FORM A RECORD CARRIER

BACKGROUND OF THE INVENTION

1. Field of the Invention

The invention relates to an arrangement for reading information from a record carrier, the arrangement comprising:
- a read head ($R_{mr1}$),
- amplifier means (74) for amplifying the signal read by the read head,
- equalizer means (76) for equalizing the signal read by the read head,
- bit detector means (80) for detecting bits in the signal read by the read head and to a hard disk drive provided with the arrangement.

2. Description of the Related Art

Such arrangement is known from U.S. Pat. No. 5,559,646 and is used for reading information from a hard disk. It should however be noted that the invention is not restricted to an application in the magnetic field. The invention is equally well applicable in the optical field. Therefore, in such application in the optical field, a read head understood to be a photo diode, as is used in optical recording, and where the signal shift, to be discussed hereafter, could have been caused by a fingerprint on the optical disk, as an example.

Amplifiers for magneto-resistive (MR) heads sense very small variations in the MR resistance (typically 1%), and amplify these signals. MR elements are biased by either a voltage or a current. Variations in the resistance of the MR heads, due to a magnetic field, result in small signal voltages and/or currents which can be detected by the sense amplifiers. The biasing of the MR heads causes a DC voltage across the head. MR sense amplifiers must be AC coupled to the heads. To avoid filtering at the low end of the data frequency spectrum, which results in data distortion, the AC coupling has a long time constant, typically at 1 µs. Large transients, such as those caused during thermal asperities, pass the AC coupling and can cause the amplifier to overload, resulting in loss of data during long periods.

SUMMARY OF THE INVENTION

The invention aims at providing an improved arrangement for reading information from the record carrier. In accordance with the invention, the arrangement is characterized in that the arrangement further comprises
- DC correction means (78) for subtracting a correction value from an input signal in response to an error signal so as to obtain a DC correction output signal, the bit detection means (80) being adapted to detect a sequence of bits based in the DC corrected output signal,
- error signal generating means (82,83,85) for generating the error signal in response to the corrected output signal and the sequence of bits.

The invention is based on the following recognition.

The MR heads fly above the disk at very low heights (typically 10 nm). When a collision with a particle on the disk takes place, kinetic energy is transformed to heat. The resistance of the MR elements increases (maximally some 10–20%). As the bias current remains constant, the baseline voltage (that is: the low frequency component of the output signal) increases rapidly. Further, the signal amplitude of the wanted signal changes by not more than the same 10–20%. After the thermal asperity, the MR element cools down slowly. These large unwanted baseline shifts can saturate the read amplifier during long periods.

Although the saturation can be avoided by using non-linear control loops in the input stage(s) of the preamplifier, see earlier filed but not yet published European Patent Application No. 98402802.7, having a filing date Dec. 11,1998 corresponding to U.S. (PHN 17177), the residual baseline shifts can still cause loss of data over long periods of time.

By carrying out additional (fast) baseline correction, the effects of the thermal asperities can be further suppressed. In addition, it may be required to add a detection circuit to detect thermal asperities, e.g., so as to freeze the control circuits in the read out circuit, in the event that the thermal asperities would otherwise severely distort the read out circuit.

BRIEF DESCRIPTION OF THE DRAWINGS

These and other aspects of the invention will be discussed in more detail hereinafter with reference to the disclosure of preferred embodiments in the figure description, in which.

BRIEF DESCRIPTION OF THE PREFERRED EMBODIMENT

First, a short description will be given of an amplifier circuit comprising a non-linear transconductance amplifier, described in European Patent Application No. 98400243.6 filed on May. 2, 1998 (PHN 16750), that could be used as an input amplifier for the reading arrangement in accordance with the present invention.

Figure 1:
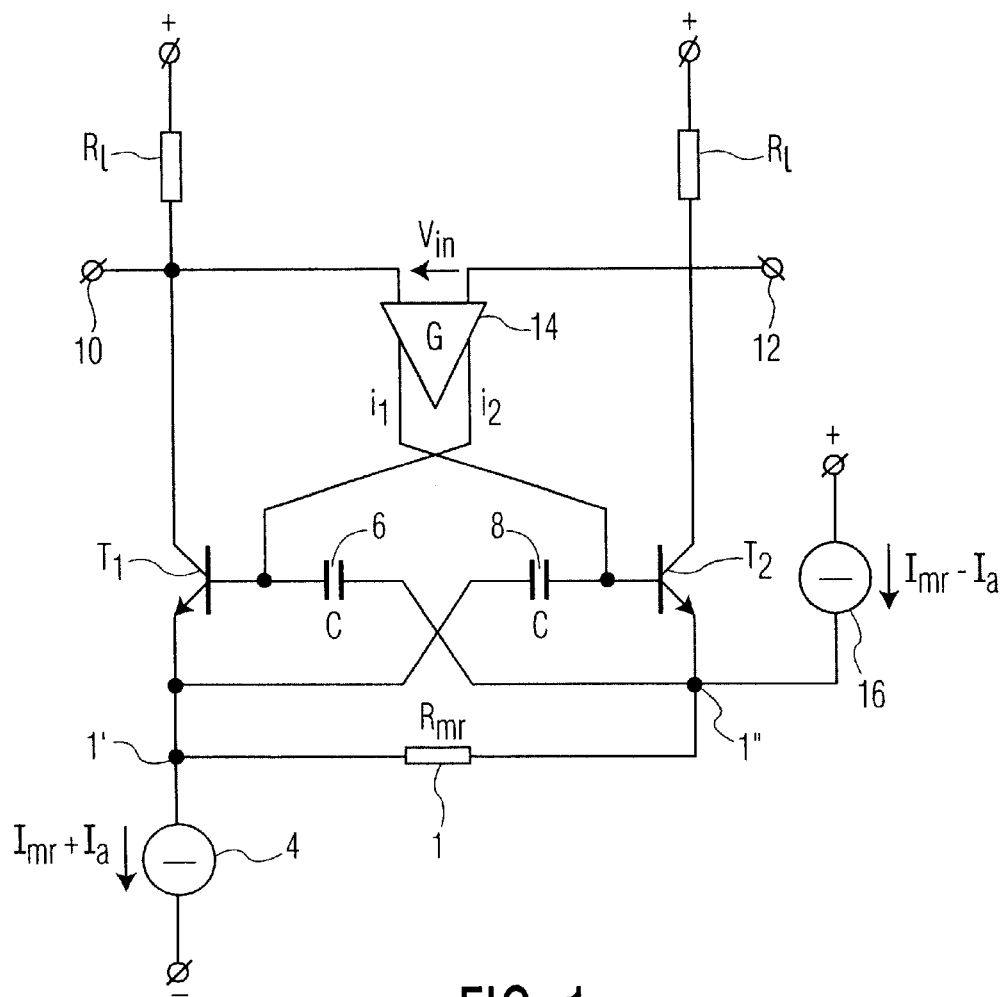
FIG. 1 shows a read amplifier circuit comprising a non-linear transconductance amplifier.

The amplifier circuit of FIG. 1 has inputs 1' and 1" for coupling to a magneto-resistive read head (not shown) having a magneto-resistive element 1, having a resistance value $R_{mr}$. A first transistor $T_1$ of the npn type is available having a collector terminal coupled to a first point of constant potential (+) via a resistor $R_1$ and having an emitter terminal coupled to a second point of constant potential (−), via a bias current source 4. The emitter terminal is also coupled to one terminal of the magneto-resistive element 1. A second transistor $T_2$ of the npn type is available having a collector terminal coupled to the first point of constant potential (+) via a resistor $R_1$ and an emitter terminal coupled to the other terminal of the magneto-resistive element 1, as well as to a bias current source 16. The base terminal of the transistor $T_1$ is coupled to the emitter electrode of the transistor $T_2$ via a first capacitive element 6, having a capacitance value C. The base terminal of the transistor $T_2$ is coupled to the emitter electrode of the transistor $T_1$ via a second capacitive element 8 having a capacitance value C. The terminals 10,12 form the output terminals of the amplifier circuit.

Figure 2:
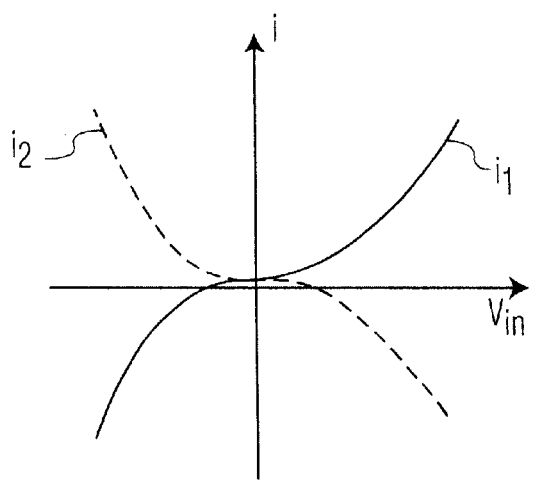
FIG. 2 shows amplifier characteristics of the non-linear transconductance amplifier of the arrangement for generating the control currents.

A non-linear transconductance amplifier 14 is provided which has a first and a second input coupled to the output terminals 10 and 12, respectively, of the amplifier circuit. The amplifier 14 has first and second outputs coupled to the base terminals of the transistor $T_1$ and $T_2$, respectively. The transconductance amplifier 14 is designed to supply control currents at its first and second outputs in response to a voltage $V_{in}$. More specifically, FIG. 2 presents two possible characteristics of the transconductance amplifier 14 for generating the control currents $i_1$ and $i_2$. FIG. 2 shows the control currents $i_1$ and $i_2$ as a function of the input voltage $V_{in}$. The non-linear characteristic is clearly visible in the figure. FIG. 2 shows a gradual increase in the slope (apart from its sign) for increasing input voltage level. Instead of this, it is also possible to have at least two regions with each a linear characteristic, where the slope of the characteristic in the region of higher input voltages is steeper than in the lower region. FIG. 2 shows a gradual increase in slope for increasing input voltage level. The bias current source 4 generates a current $I_{mr}+I_a$ and the current source 16 generates a current $I_{mr}-I_a$. $I_a$ is the quiescent current that flows through the transistors $T_1$ and $T_2$ and $I_{mr}$ is the bias current that flows through the MR element 1.

It should be noted in this respect that the embodiment of FIG. 1 is only a schematic embodiment in the sense that it only shows the elements that are essential for explaining the invention. More specifically, FIG. 1 does not show all the elements that are needed to realize the common mode setting of the read amplifier. Those elements are however well known for the skilled person.

The functioning of the amplifier circuit is as follows. The amplifier circuit is based on a cross-coupled architecture, as is known from U.S. Pat. No. 5,559,646. This is optimum for noise and bandwidth. The AC coupling, formed by the capacitors 6 and 8 is biased by feedback from output to input (the bases of the transistors $T_1$ and $T_2$) to output (the terminals 10,12), via the transconductance amplifier 14. Amplifier in the prior art, the transconductance 14 exhibits a linear characteristic. The AC coupling time constant is therefore fixed and large.

The AC coupling time constant can be expressed as: $C \cdot (R_{mr}+R_{in})/2 \cdot G_m \cdot R_1$, where $R_{in}$ equals $k \cdot T/q \cdot I_a$. The non-linear transconductance 14 therefore provides a large time constant for small input signals, but provides a small time constant for larger signals. In fact, the resultant behavior is that the low frequency cutoff of the amplifier is shifted to higher frequencies for higher input signal levels.

The embodiment of FIG. 1 shows a single stripe magneto-resistive element. An embodiment of an amplifier circuit for a dual-stripe magneto-resistive head has been disclosed in the above mentioned earlier filed European Patent Application No. 98400243.6.

Figure 3:
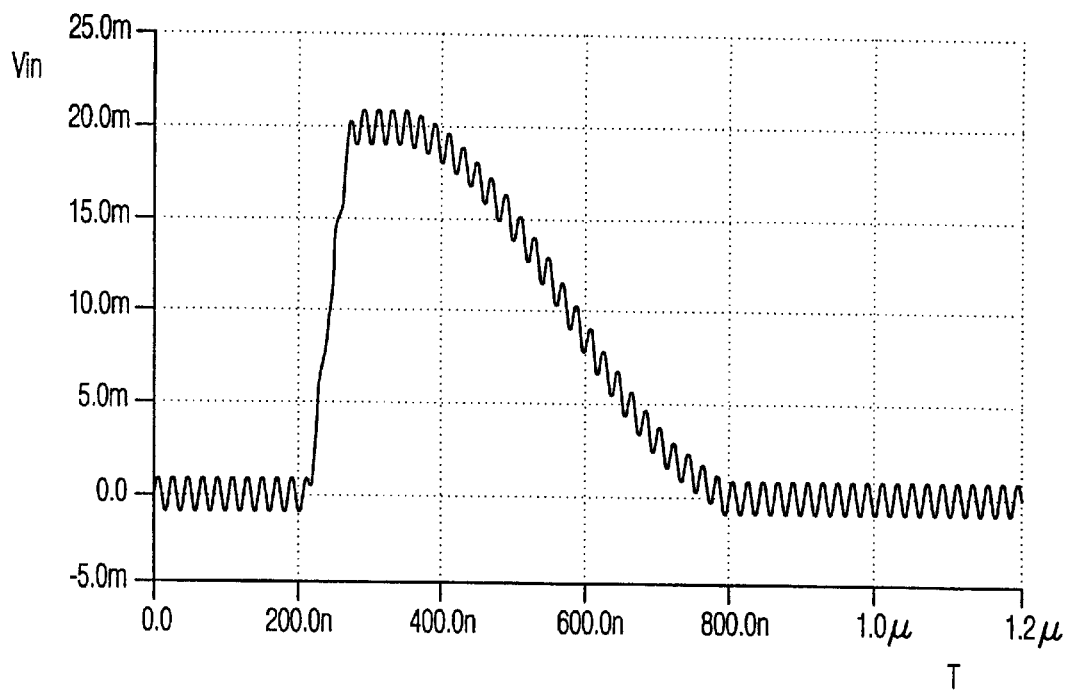
FIG. 3 shows an input signal for the read amplifier circuit as a function of time, distorted by an asperity.
Figure 4:
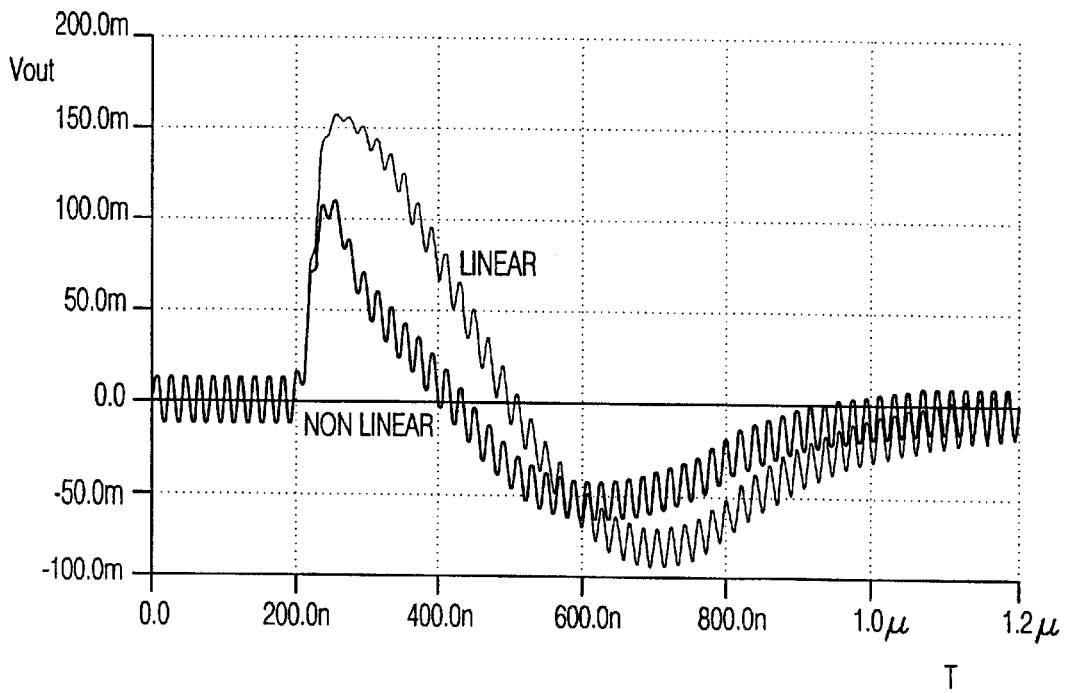
FIG. 4 shows two output signals as a function of time, one for a read amplifier provided with a linear transconductance amplifier and one for a read amplifier provided with a non-linear transconductance amplifier.

FIG. 3 shows an input signal applied to the amplifier circuit of FIG. 1. The asperity accounts for the sharp increase in the input signal. FIG. 4 shows two output signals. One denoted 'linear', is obtained with a read amplifier circuit exhibiting a linear control characteristic and the output signal denoted 'non-linear' is obtained with the read amplifier circuit of FIG. 1. Clearly visible is that the wanted signal, which is the sinusoid superimposed on the asperity signal remains visible through the asperity, while the peak value of the asperity signal is reduced.

The read amplifier circuit described above can be followed in a later stage by a DC correction circuit. This DC correction circuit can function on signals having a higher amplitude, so that a further asperity reduction can be obtained in this correction circuit.

Figure 5:
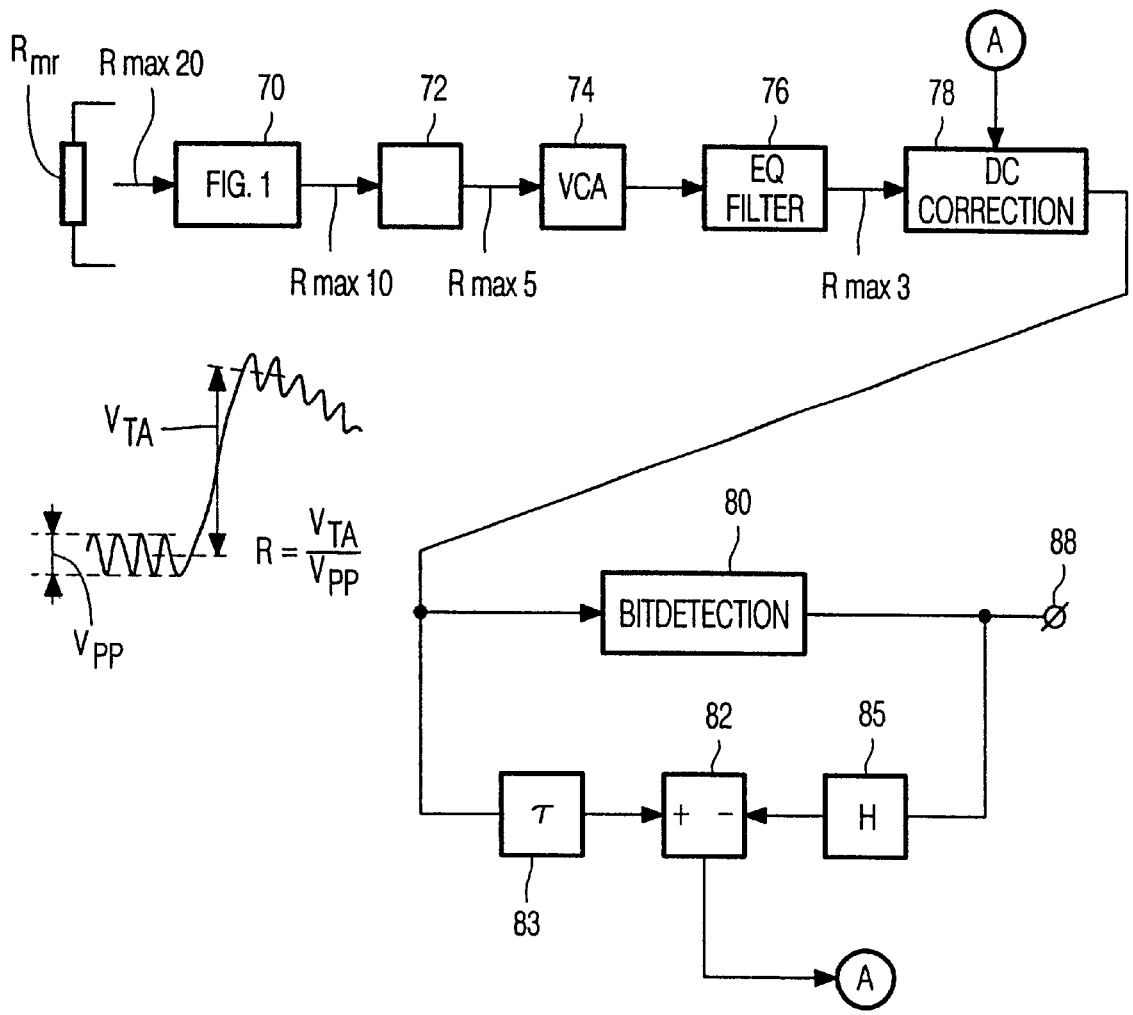
FIG. 5 shows an embodiment of the arrangement in accordance with the invention, provided with a DC correction circuit for (further) correcting the thermal asperity.

FIG. 5 shows an embodiment of the reading arrangement in accordance with the invention, provided with this DC correction (or baseline correction) circuit. The magneto-resistive head $R_{mr}$ is coupled to a block 70 which denotes the non-linear amplifier circuit as described above with reference to FIG. 1. The output of the block 70 is coupled to an input of a block 72 which realizes an AC coupling and can be in the form of a highpass filter circuit, or a capacitor. The output of the block 72 is coupled to an input of a block 74 which comprises a variable gain amplifier, which has an output coupled to a block 76, which is in the form of an equalizer filter. The output of the equalizer filter 76 is coupled to a block 78 which carries out a DC correction on its input signal. An output of the block 78 is coupled to inputs of a bit detection block 80 and a subtractor unit 82, to the latter via a delay unit 83. An output of the bit detection block 80 is coupled to an output terminal 88 as well as, via a filter unit 85, to a second input of the subtractor unit 82. An output of the subtractor unit 82 is coupled via a connection denoted by A to a control input of the correction unit 78.

The function of the non-linear amplifier circuit 70 is to suppress the thermal asperities to avoid overflow of the preamplifier. Suppose, as an example, that the amplitude ratio R, defined as the ratio of the amplitude of the thermal asperity $V_{TA}$ and the peak-peak amplitude $V_{pp}$ of the information signal, in the output signal of the read head $R_{mr}$ is at maximum 20, then, the amplifier 70 might, in unfavorable conditions, result in a ratio in its output signal of around 10. Under the influence of the AC coupling in the block 72 and the signal processing in the blocks 74 and 76, the ratio R is further decreased, for example, to a value of 3. Now, in this situation, it is possible to further suppress the influence of the thermal asperities by carrying out a DC or baseline correction.

If the target of the baseline correction would be to zero the mean value of the input signal to the bit detector, the performance of the control loop would depend on the specific data pattern, in particular, when the loop reacts fast (as is desired to correct thermal asperities). Therefore, first all data parts (the data itself and filtered data, which is fed back to compensate ISI in the signal) are removed in the subtractor 82. The resulting signal: the error signal, consists of the baseline and the noise. The control, in principle, becomes data independent and can be fast.

In order to realize a correct error signal in the subtractor 82, it is required to filter the detected data signal at the output of the bit detector unit 80, in the filter unit 85. The filter unit 85 has such a filter response H(f), that it replicates the ISI-structure at the input of the bit detector unit 80. The impulse response function of the filter H(f) equals in principle the 'target' response of the detector 80 (although other choices for the impulse response are also possible and useful, especially when the DC correction loop is asynchronous). Further, delays occurring in the bit detector unit 80 and the filter unit 85 can be corrected for by the delay unit 83. For a bit detector unit 80 in the form of a slicer, the circuit is simplified in that the blocks 83 and 85 can be dispensed with.

Figure 6:
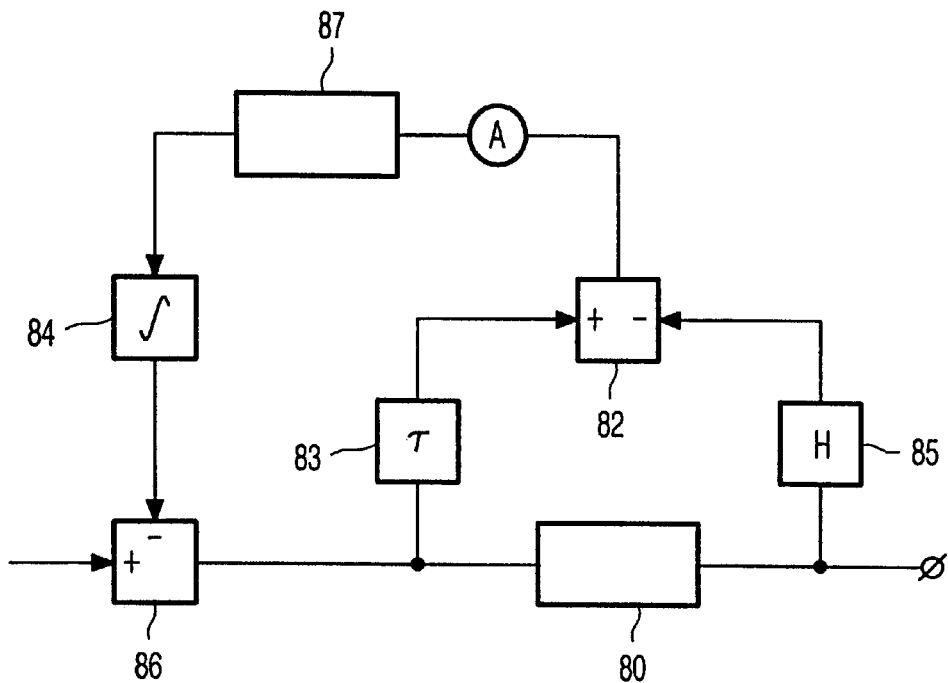
FIG. 6 shows an elaborated version of the DC correction circuit of figure.

FIG. 6 shows the complete circuit that realizes the DC correction in more detail. An error signal is generated which is the difference between the input signal to the bit detector unit 80 and the (possibly filtered) output signal of the bit detector unit 80, that is: the actual data signal and possibly ISI. The bit detector unit 80 can be asynchronous, or can include a sampler. The error signal obtained by the subtractor unit 82 is fed, via the line denoted A, to an integrating circuit 84 included in the DC correction unit 78. The output signal of the integrating circuit 84 is a measure of the DC value in the input signal of the subtractor unit 86, which is again a measure of the remaining influence of the asperities at this stage in the read-out circuit. The functioning of the DC correction is such that the error signal on the line denoted A is controlled towards zero.

The DC correction is based on the error signal. Because the data is already removed from the error signal in the block 82, in principle, only the DC offset or baseline error is fed back, not the data. Therefore, the DC correction does not distort the data. This is contrary to prior art ways of solving this problem, such as the switching of the cut-off frequency of the AC coupling temporarily to a higher value when an asperity is detected. Also, the non-linear control of the AC coupling in the block 72 influences the data. For this reason, the nonlinear control in the amplifier input only avoids overloading of the amplifier stages. The rest of the correction is done by the baseline correction which is based on the error signal.

By making the DC correction fast (by increasing the loop gain), the data can be read, even though aggressive asperities, without making lots of errors. With the further use of ECC techniques, it is possible to read through most asperities, without uncorrectable errors. Fast detection requires a short loop delay. Preferably, the equalizer should not be in the loop (as in FIG. 5) and the delay of the bit detector should be short. Often, the latter delay can be reduced by using preliminary bit decisions for the control loop, instead of final ones.

The DC correction control loop can be non-linear, in the sense that for small amplitude asperities, the time constant of the loop is relatively large and that for large amplitude asperities, the time constant is smaller. Making the time constant in the loop smaller can be realized by increasing the loop gain. This can be done in an automatic fashion by inserting a suitable non-linearily block 87 between blocks 82 and 84. The nonlinearity should be odd, and should basically provide a gain that increases with input signal amplitude. For sufficiently large signal amplitudes the gain may level off again so as to restrict dynamic range of the resulting output signal and simplify implementation.

The nonlinearity provides extra loop gain and hence faster response to large deviations from the wanted situation.

By introducing some hysteresis, the increased loop gain can be maintained for a somewhat longer time so as to reduce the duration of the tail of the loop-settling response.

Figure 7:
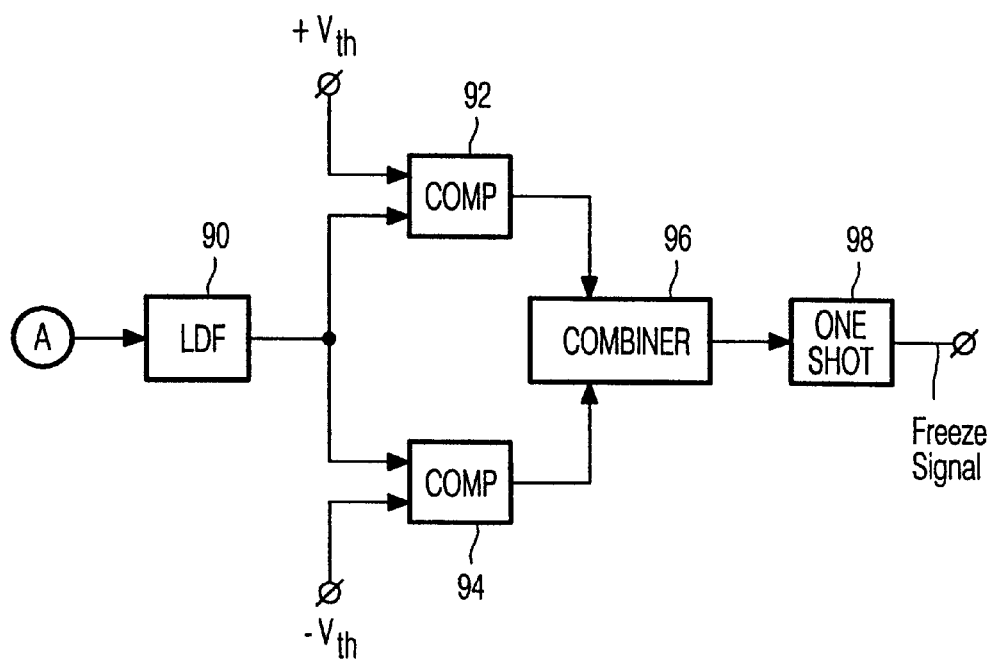
FIG. 7 shows a detector circuit for detecting the thermal asperities.

FIG. 7 shows a circuit arrangement for detecting residual asperities, i.e., for detecting any asperity effects in front of the bit detector, possibly after application of the aforementioned suppression and compensation techniques. The circuit arrangement of FIG. 7 comprises a low-pass filter unit 90, which has an output coupled to inputs of comparator circuits 92 and 94. Outputs of the comparator circuits are coupled to corresponding inputs of a combiner circuit 96, which has an output coupled to a one-shot circuit 98.

A thermal asperity detector is needed in order to improve the reliability of the read arrangement. It can warm the read arrangement that there can be a problem with the corresponding part of the data signal. Precautionary actions can be taken, so that the overall performance of the read out arrangement can be improved.

A prior art way of detecting asperities is to detect the peak values of the out signal and check whether they remain within certain limits. This procedure is data (PW50) dependent and is affected by DC offset. In principle, a thermal asperity detector should follow the baseline of the signal and it should detect anomalies. Thermal asperity detection in the pre-amplifier and in the channel IC does not need to be the same. In the pre-amplifier, thermal asperities are detected, independent of whether they are corrected in the read channel path, that could have been incorporated in a channel IC. This path can be identified by the blocks 72 to 82 in FIG. 5, although it should be stressed that the read channel path may comprise other circuits.

In the present invention, thermal asperity detection is carried out in the channel IC, by detecting any asperities that remain in front of the bit detector possibly after application of the aforementioned suppression and compensation techniques. These residual asperity effects manifest themselves in the form of short-term DC offsets in the error signal present at the output of subtraction circuit 82 in FIGS. 7 and 8. To detect this offset in the presence of additional disturbances that are contained in the error signal, such as residual intersymbol interference and noise, the error is first applied to a low-pass filter. It is then compared to positive and negative threshold values +Vth and −Vth, respectively. When the signal applied to the comparators 92 and 94 exceeds one of the threshold values, a residual thermal asperity-effect is detected. The output signals of the comparator units 92 and 94 are combined in the combiner 96 and a one shot 98 may be provided to lengthen the detection pulse that indicates the occurrence of a residual asperity-effect. The output signal of shot 98 can be used, for example, as an 'erasure' indicator for the error correction circuitry outside the channel IC, or as a control signal for circuits within channel IC. This control signal can be used, for example, to command the read PLL within the channel IC to coast, or the AGC within the channel IC to freeze.

While the invention has been described with reference to preferred embodiments thereof, it is to be understood that these are not limitative examples. Thus, various modifications may become apparent to those skilled in the art, without departing from the scope of the invention, as defined by the claims. As an example, the measure of the DC correction carried out and the measure to generate an asperity detection signal, as explained with reference to the FIGS. 5, 6 and 7, can be applied separately from the measure to use the non-linear read amplifier described with reference to the FIGS. 1 to 4. Also the thermal asperity detector can be used without application of baseline correction based on an error signal. Further, the invention lies in each and every novel feature and combination of features.

What is claimed is:

1. An arrangement for reading information from a record carrier, the arrangement comprising:

a read head for reading information in the form of a signal;

amplifier means coupled to said read head for amplifying the signal read by the read head;

equalizer means coupled to the amplifier means for equalizing the amplified signal; and bit detector means coupled to the equalizer means for detecting bits in the equalized and amplified signal, characterized in that the arrangement further comprises:

DC correction means for subtracting a correction value from an input signal in response to an error signal to form a DC-corrected output signal, an input of said DC correction means being coupled to an output of said equalizer means, and the bit detection means being coupled to an output of said DC correction means for detecting a sequence of bits based in the DC-corrected output signal, said DC correction means comprising integrating means for integrating the error signal to form a correction signal, and subtraction means for subtracting the correction signal from the input signal; and error signal generating means for generating the error signal in response to the DC-corrected output signal and the sequence of bits, said error signal generating means comprising subtraction means for subtracting the sequence of bits from the DC-corrected output signal, and an output, for supplying said error signal, coupled to said DC correction means.

2. The arrangement as claimed in claim 1, characterized in that the arrangement further comprises non-linear amplifying means for non-linearly amplifying the error signal prior to application of the error signal to the DC correction means.

3. The arrangement as claimed in claim 1, characterized in that the arrangement further comprises:

low-pass filtering means for filtering the error signal;

comparator means for comparing the filtered error signal with a threshold value; and means coupled to the comparator means for generating an asperity detection signal in response to the filtered error signal exceeding the threshold value.

4. A hard disk drive comprising:

a read head for reading information in the form of a signal from a hard disk;

amplifier means coupled to said read head for amplifying the signal read by the read head;

equalizer means coupled to the amplifier means for equalizing the amplified signal; and bit detector means coupled to the equalizer means for detecting bits in the equalized and amplified signal, characterized in that the hard disk drive further comprises:

DC correction means for subtracting a correction value from an input signal in response to an error signal to form a DC-corrected output signal, an input of said DC correction means being coupled to an output of said equalizer means, and the bit detection means being coupled to an output of said DC correction means for detecting a sequence of bits based in the DC-corrected output signal, said DC correction means comprising integrating means for integrating the error signal to form a correction signal, and subtraction means for subtracting the correction signal from the input signal; and error signal generating means for generating the error signal in response to the DC-corrected output signal and the sequence of bits, said error signal generating means comprising subtraction means for subtracting the sequence of bits from the DC-corrected output signal, and an output, for supplying said error signal, coupled to said DC correction means.

5. An arrangement for reading information from a record carrier, the arrangement comprising:

a read head for reading information in the form of a signal from a record carrier;

amplifier means coupled to said read head for amplifying the signal read by the read head;

equalizer means coupled to said amplifier means for equalizing the signal; and bit detector means coupled to said equalizer means for detecting bits in the signal, characterized in that the arrangement further comprises:

DC correction means for subtracting a correction value from an input signal in response to an error signal to form a DC-corrected output signal, an input of said DC correction means being coupled to an output of said equalizer means, and the bit detection means being coupled to an output of said DC correction means for detecting a sequence of bits based in the DC-corrected output signal, said DC correction means comprising integrating means for integrating the error signal to form a correction signal, and subtraction means for subtracting the correction signal from the input signal; and error signal generating means for generating the error signal in response to the DC-corrected output signal and the sequence of bits, said error signal generating means comprising subtraction means for subtracting the sequence of bits from the DC-corrected output signal, and an output, for supplying said error signal, coupled to said DC correction means;

low-pass filtering means for filtering the error signal;

comparator means for comparing the filtered error signal with a threshold value; and means coupled to said comparator means for generating an asperity detection signal in response to the filtered error signal exceeding the threshold value.

* * * * *

Disclaimer

6,381,082 B1 — Johannes O. Voorman, Eindhoven (NL); Johnannes W. M. Bergmans, Eindhoven (NL). ARRANGEMENT FOR READING INFORMATION FROM A RECORD CARRIER. Patent dated April 30, 2002. Disclaimer filed March 28, 2008, by the assignee, U.S. Philips Corporation.

Hereby enters this disclaimer to all claims of said patent.

*(Official Gazette May 12, 2009)*